United States Patent
Ju et al.

(10) Patent No.: US 8,570,745 B2
(45) Date of Patent: Oct. 29, 2013

(54) ELECTRICAL CONNECTOR ASSEMBLY

(75) Inventors: Ted Ju, Keelung (TW); Chin Chi Lin, Keelung (TW)

(73) Assignee: Lotes Co., Ltd., Keelung (TW)

( * ) Notice: Subject to any disclaimer, the term of this patent is extended or adjusted under 35 U.S.C. 154(b) by 230 days.

(21) Appl. No.: 13/310,101

(22) Filed: Dec. 2, 2011

(65) Prior Publication Data

US 2013/0077252 A1    Mar. 28, 2013

(30) Foreign Application Priority Data

Sep. 26, 2011   (CN) .................. 2011 2 0366791 U

(51) Int. Cl.
*H05K 7/20*     (2006.01)
*H05K 1/14*     (2006.01)

(52) U.S. Cl.
USPC ...... 361/704; 361/679.54; 361/707; 361/710; 361/719; 165/80.3; 165/104.33; 257/686; 257/738; 257/719; 257/707; 257/712

(58) Field of Classification Search
USPC .................. 361/679.46–679.55, 690–697, 361/704–714, 715–724; 165/80.2–80.5, 165/104.33, 104.34, 121–126, 185; 257/666, 686, 698, 706–727, 738, 796; 174/15.1, 16.3
See application file for complete search history.

(56) References Cited

U.S. PATENT DOCUMENTS

| | | | | |
|---|---|---|---|---|
| 6,219,243 B1* | 4/2001 | Ma et al. | ......... | 361/704 |
| 6,368,894 B1* | 4/2002 | Shen | ............. | 438/106 |
| 6,490,161 B1* | 12/2002 | Johnson | ......... | 361/704 |
| 6,580,611 B1* | 6/2003 | Vandentop et al. | ........ | 361/704 |
| 6,807,061 B1* | 10/2004 | Harris | ............. | 361/719 |
| 7,151,308 B2* | 12/2006 | Tao et al. | ......... | 257/683 |
| 7,235,880 B2* | 6/2007 | Prokofiev | ......... | 257/734 |
| 7,268,425 B2* | 9/2007 | Mallik et al. | ......... | 257/706 |
| 7,456,047 B2* | 11/2008 | Mallik et al. | ......... | 438/108 |
| 7,755,186 B2* | 7/2010 | Chiu et al. | ......... | 257/714 |
| 7,872,359 B2* | 1/2011 | Inoue | ............. | 257/784 |
| 7,932,596 B2* | 4/2011 | Mallik et al. | ......... | 257/712 |
| 8,193,627 B2* | 6/2012 | Kudose et al. | ........ | 257/687 |
| 8,264,851 B2* | 9/2012 | Jafari et al. | .......... | 361/784 |
| 8,472,190 B2* | 6/2013 | Refai-Ahmed et al. | ...... | 361/704 |
| 8,482,120 B2* | 7/2013 | Jafari et al. | .......... | 257/712 |
| 2007/0075412 A1* | 4/2007 | Reid et al. | ......... | 257/686 |
| 2012/0075807 A1* | 3/2012 | Refai-Ahmed et al. | ...... | 361/719 |

* cited by examiner

*Primary Examiner* — Michail V Datskovskiy
(74) *Attorney, Agent, or Firm* — Morris Manning & Martin LLP; Tim Tingkang Xia, Esq.

(57) ABSTRACT

The invention relates to an electrical connector assembly. The electrical connector assembly includes a main circuit board having a through hole, a processor, and an auxiliary circuit board. The processor includes a chip and a substrate. The chip is electrically connected to the substrate and located in the through hole. The substrate is at least partially located in the through hole. The auxiliary circuit board has a transitional connecting surface. A first conducting region and a second conducting region electrically connected to each other are disposed on the transitional connecting surface. The first conducting region is electrically connected to the substrate, and the second conducting region is electrically connected to the main circuit board.

13 Claims, 8 Drawing Sheets

ELECTRICAL CONNECTOR ASSEMBLY

CROSS-REFERENCE TO RELATED APPLICATIONS

This non-provisional application claims priority under 35 U.S.C. §119(a) on Patent Application No. 201120366791.1 filed in P.R. China on Sep. 26, 2011, the entire contents of which are hereby incorporated by reference.

Some references, if any, which may include patents, patent applications and various publications, may be cited and discussed in the description of this invention. The citation and/or discussion of such references, if any, is provided merely to clarify the description of the present invention and is not an admission that any such reference is "prior art" to the invention described herein. All references listed, cited and/or discussed in this specification are incorporated herein by reference in their entireties and to the same extent as if each reference was individually incorporated by reference.

FIELD OF THE INVENTION

The present invention generally relates to an electrical connector assembly, and more particularly to an electrical connector assembly for electrically connecting a processor and a circuit board.

BACKGROUND OF THE INVENTION

Currently, the electrical connection between processors and circuit boards is generally realized through electrical connectors. However, in order to reduce the overall height of the electrical connector assembly to follow the development trend of electronic products such as notebook computers towards ultra-thin structures, the use of electrical connector is usually avoided in the industry, and instead, contact points on a lower surface of the processor are connected to solder pads on a surface of the circuit board by using a solder material, so as to achieve the electrical connection between the processor and the circuit board.

Alternatively, Chinese Patent No. CN200520053773.2 provides a chip module having double-sided heat dissipation effect. Referring to FIGS. 3-6 of the accompanying drawings for the specification of the above patent, the chip module includes a substrate and a first thermally conductive region and a second thermally conductive region located on upper and lower sides of the substrate. The substrate includes an integrated circuit located in the center thereof, on which the first thermally conductive region and the second thermally conductive region are disposed opposite to each other. A connecting portion substantially perpendicular to the substrate is disposed at a position where the second thermally conductive region and the substrate are in contact. The connecting portion may be received in a receiving housing disposed on the circuit board. Evenly arranged electrically conductive regions are disposed around the substrate. The electrically conductive regions are located on one side of the substrate, and may be formed with rectangular or round shape. The electrically conductive regions are arranged in one or more rows, and may be directly soldered to the circuit board, so as to achieve the electrical connection between the chip module and the circuit board.

Such an electrical connector structure easily incurs the following problems.

1. As the thermally conductive regions are disposed on the upper and lower sides of the substrate, although such a structure can achieve double-sided heat dissipation to improve the heat dissipation efficiency, the method of increasing heat dissipation area sacrifices the height. As compared with a chip module only one side of which is provided with a thermally conductive region, the chip module of such a structure is thicker by at least the thickness of the second thermally conductive region, and thus cannot follow the development trend of electronic products towards ultra-thin structures and is inapplicable to notebook computers.

2. As the thermally conductive regions are disposed on the upper and lower sides of the substrate, and the electrical connection between the substrate and the circuit board needs to be realized through the electrically conductive regions, the electrically conductive regions can only be disposed around the substrate, which requires changing the design of solder joints in the existing chip module which are arranged downwards in a matrix in the central region of the substrate. Moreover, as the thermally conductive regions are already disposed on the substrate, only a small area is left on the substrate for disposing the electrically conductive regions. Therefore, when a large number of solder joints of the electrically conductive regions are required, it is difficult to dispose the large number of solder joints in such a small area on the substrate. As a result, the process complexity is increased, and the dense arrangement of solder joints easily causes short circuit.

Therefore, a heretofore unaddressed need exists in the art to address the aforementioned deficiencies and inadequacies.

SUMMARY OF THE INVENTION

In one aspect, the present invention is directed to an electrical connector assembly having a thinner structure for connecting a processor and a circuit board.

In one embodiment, an electrical connector assembly according to the present invention includes a main circuit board having a through hole, a processor and an auxiliary circuit board. The processor includes a chip and a substrate. The chip is electrically connected to the substrate and located in the through hole of the main circuit board. The substrate is at least partially located in the through hole of the main circuit board. The auxiliary circuit board has a transitional connecting surface. A first conducting region and a second conducting region electrically connected to each other are disposed on the transitional connecting surface. The first conducting region is electrically connected to the substrate, and the second conducting region is electrically connected to the main circuit board.

Further, the substrate has a first conducting surface and a second conducting surface disposed opposite to each other. The first conducting surface is electrically connected to the chip. A plurality of contact members is disposed on the second conducting surface of the substrate and electrically connected to the first conducting region of the auxiliary circuit board.

The contact members are arranged on the second conducting surface of the substrate in a matrix.

The thickness of the auxiliary circuit board is smaller than that of the main circuit board.

In another embodiment, the main circuit board has an upper surface and a lower surface disposed opposite to each other. The second conducting region of the auxiliary circuit board is electrically connected to the lower surface of the main circuit board. The chip has a top surface located in the through hole and not exceeding the upper surface of the main circuit board.

In yet another embodiment, the main circuit board has an upper surface and a lower surface disposed opposite to each other. The second conducting region of the auxiliary circuit board is electrically connected to the upper surface of the main circuit board. The chip has a bottom surface located in the through hole and not exceeding the lower surface of the main circuit board.

In a further embodiment, the main circuit board is connected and fixed to the auxiliary circuit board through a fixing member.

In another embodiment, the processor further includes a metal shell at least partially located in the through hole and covering the chip.

In another embodiment, a heat dissipation device is disposed on one side of the main circuit board to contact the processor.

In another embodiment, the heat dissipation device at least partially enters the through hole.

In another embodiment, the main circuit board is recessed with a groove in lateral communication with the through hole, and the auxiliary circuit board at least partially enters the groove and is electrically connected to the main circuit board.

As compared with the related art, in the present invention, among other things, as the through hole is formed in the circuit board, the chip is disposed in the through hole, and the substrate is at least partially located in the through hole, the processor and the main circuit board mostly overlap with each other in view of height, which further reduces the overall height of the electrical connector assembly, and can meet the requirements for development of notebook computers towards ultra-thin structures. Moreover, as both the processor and the main circuit board are electrically connected to the transitional connecting surface of the auxiliary circuit board, an ultra-thin auxiliary circuit board can be used to implement the connection between the main circuit board and the processor, so that the height is reduced without changing the design of solder joints of the processor in the related art, thereby achieving high compatibility.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the invention and together with the written description, serve to explain the principles of the invention. Wherever possible, the same reference numbers are used throughout the drawings to refer to the same or like elements of an embodiment, and wherein.

DETAILED DESCRIPTION OF THE INVENTION

Figure 1:
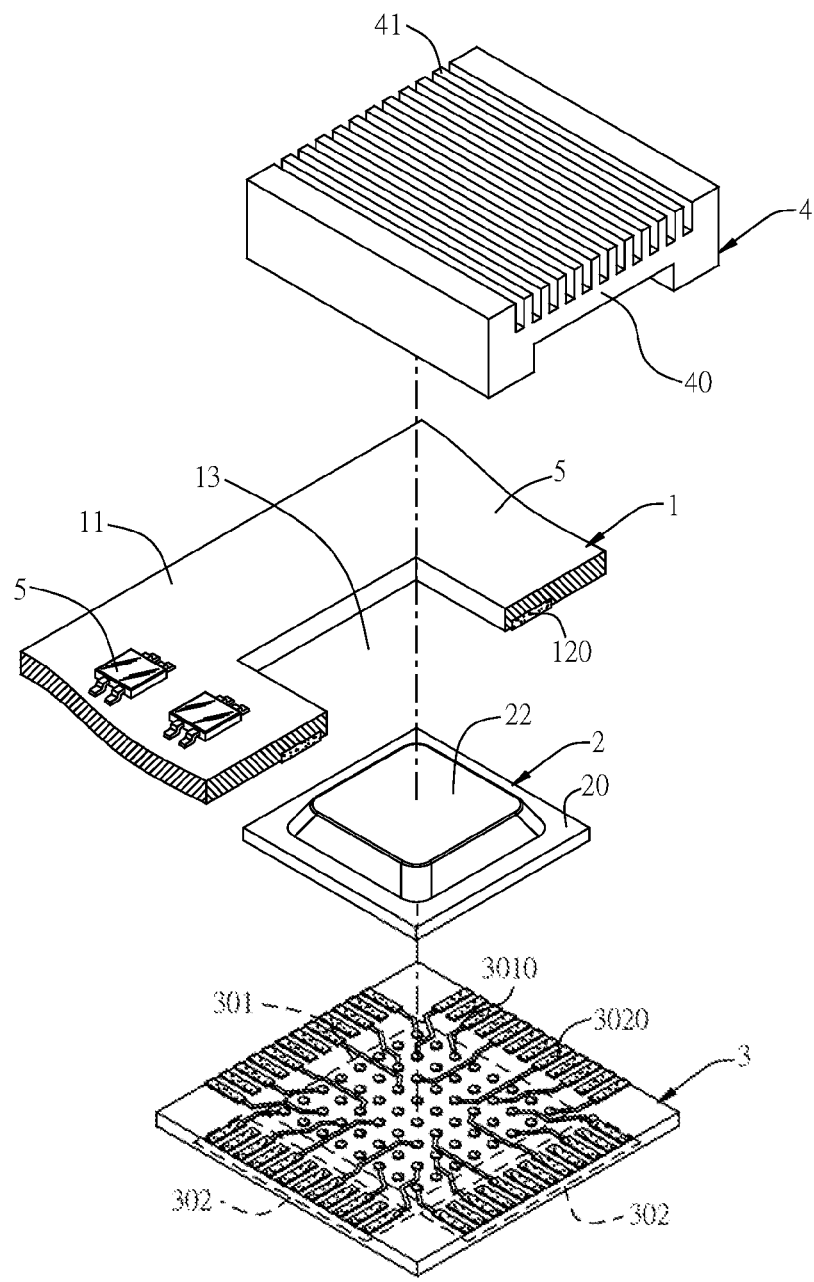
FIG. 1 is an exploded three-dimensional view of an electrical connector assembly according to a first embodiment of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

Referring to FIG. 1, an electrical connector assembly according to one embodiment of the present invention includes a main circuit board 1, a processor 2, an auxiliary circuit board 3 respectively electrically connected to the processor 2 and the main circuit board 1, and a heat dissipation device 4 mounted on the main circuit board 1 and contacting the processor 2.

Figure 2:
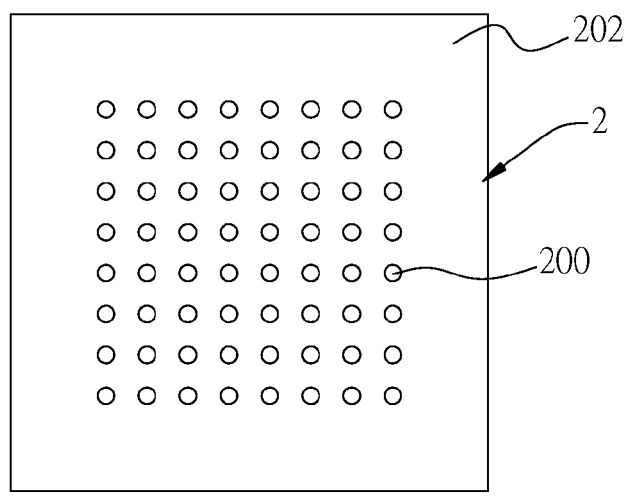
FIG. 2 is a bottom view of a processor in the electrical connector assembly according to the first embodiment of the present invention.
Figure 3:
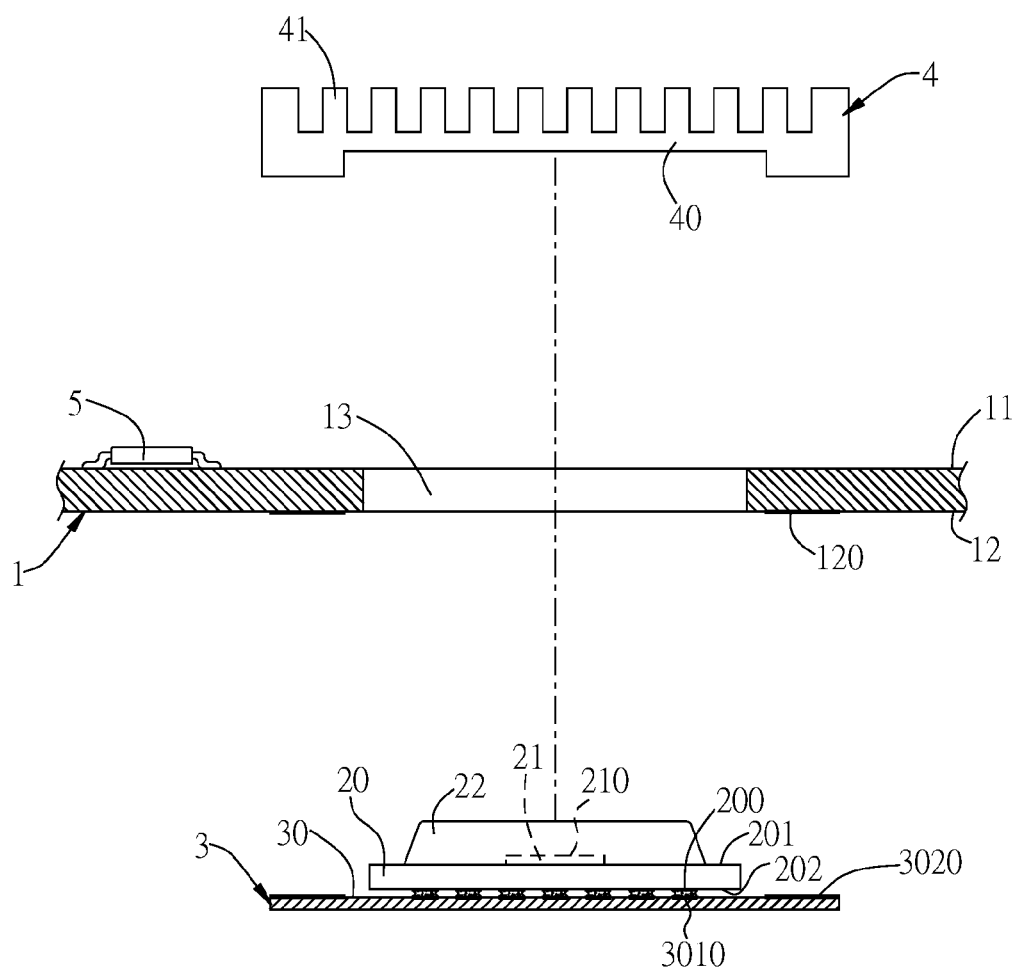
FIG. 3 is an exploded cross-sectional view of the electrical connector assembly according to the first embodiment of the present invention.

FIGS. 1-5 show an electrical connector assembly according to a first embodiment of the present invention. Referring to FIG. 1 and FIG. 3, the main circuit board 1 is a mother board used in a computer, and has an upper surface 11 and a lower surface 12 opposite to each other. The upper surface 11 is used for mounting electronic elements such as heat sinks, capacitors and resistors, and is an electronic element mounting surface 11. The lower surface 12 is used for being mounted to a computer chassis and adjacent to a side wall of the computer chassis, and is a chassis mounting surface 12. Generally, the mother board is secured onto the computer chassis through screws. To mount dual in-line package (DIP) electronic elements on the electronic element mounting surface 11 of the main circuit board 1, a gap is formed between the chassis mounting surface 12 of the main circuit board 1 and the side wall of the chassis (not shown). In this embodiment, an electronic element 5 is disposed on the electronic element mounting surface 11 of the main circuit board 1. A plurality of solder pads 120 is formed on the chassis mounting surface 12, and used for electrically connecting the auxiliary circuit board 3. The main circuit board 1 further has a through hole 13 formed through the electronic element mounting surface 11 and the chassis mounting surface 12.

Figure 4:
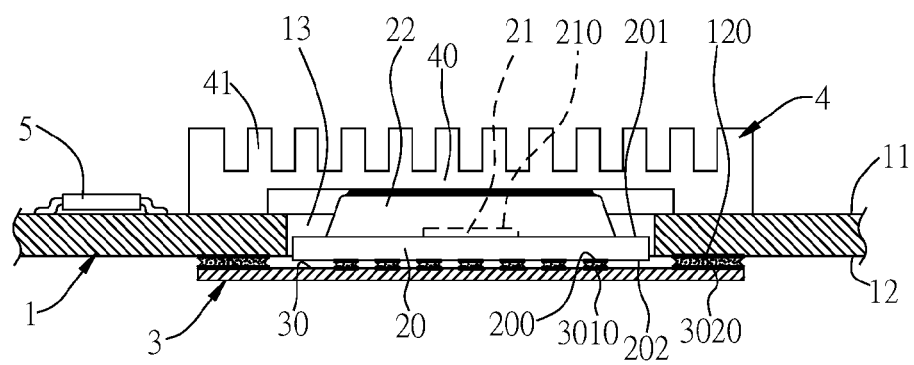
FIG. 4 is an assembled cross-sectional view of the electrical connector assembly according to the first embodiment of the present invention.

The processor 2 includes a substrate 20 and a plurality of chips 21 (only one chip 21 is illustrated in the accompanying drawings). The substrate 20 has a first conducting surface 201 electrically connected to the chip 21, and a second conducting surface 202 opposite to the first conducting surface 201. A plurality of contact members 200 is disposed on the second conducting surface 202. Referring to FIG. 2, the contact members 200 are substantially located in the center of the second conducting surface 202 and arranged in a matrix. Referring to FIG. 4, to reduce the height of the electrical connector assembly, both the size of the chip 21 and the size of the substrate 20 are smaller than the size of the through hole 13. Viewed from the lateral side, the substrate 20 is partially located in the through hole 13, the chip 21 is completely located in the through hole 13, and the top surface 210 of the chip 21 does not exceed the electronic element mounting surface 11 of the main circuit board 1.

In this embodiment, the processor 2 further includes a metal shell 22. The metal shell 22 is disposed on the first conducting surface 201 of the substrate 20, covers the chip 21, and is used for protecting the chip 21 and providing a heat dissipation function during operation of the processor 2. Likewise, to reduce the height of the electrical connector assembly, the metal shell 22 is partially located in the through hole 13.

Figure 5:
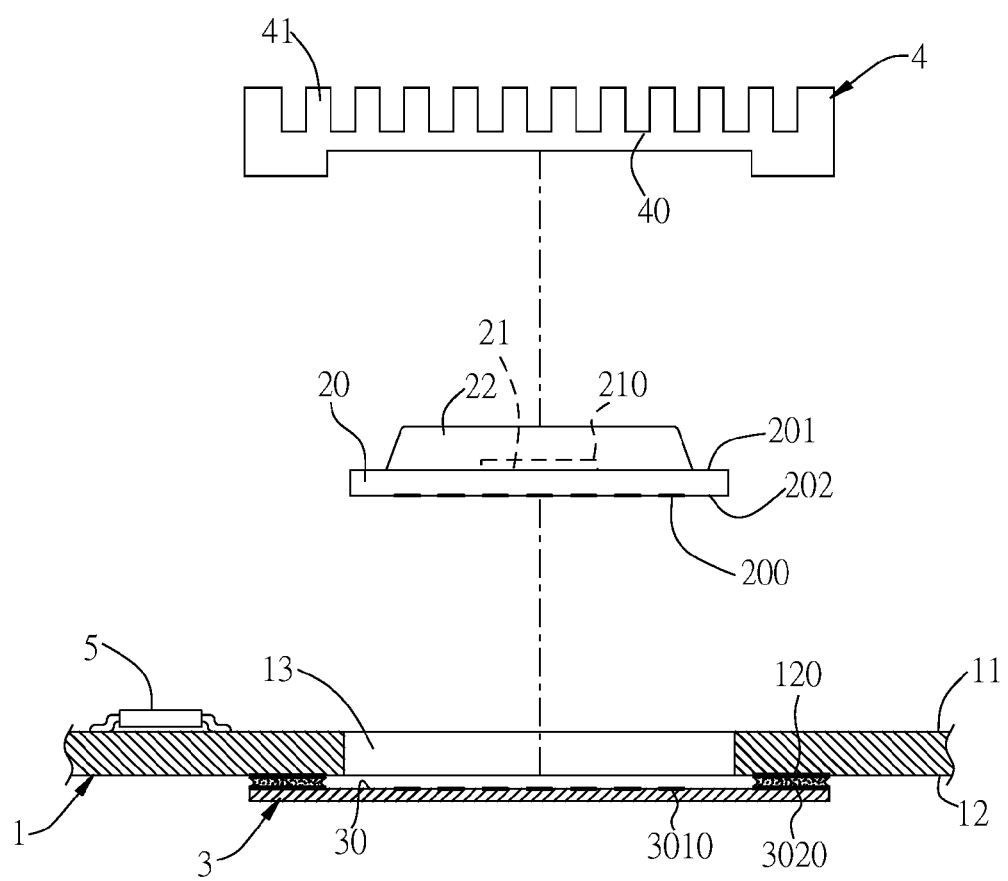
FIG. 5 is another assembled cross-sectional view of the electrical connector assembly according to the first embodiment of the present invention.

Referring to FIG. 1 and FIG. 5, the auxiliary circuit board 3 is located below the main circuit board 1, and the thickness of the auxiliary circuit board 3 is far smaller than that of the main circuit board 1. The auxiliary circuit board 3 has a transitional connecting surface 30. A first conducting region 301 and a second conducting region 302 are disposed on the transitional connecting surface 30. The first conducting region 301 includes a plurality of first electrically conductive sheets 3010 arranged in a matrix and correspondingly soldered to the contact members 200 by using a solder material. The second conducting region 302 is located outside of the first conducting region 301, and includes a plurality of second electrically conductive sheets 3020 soldered to the solder pads 120 of the main circuit board 1 by using a solder material. The first electrically conductive sheets 3010 and the corresponding second electrically conductive sheets 3020 are electrically connected to one another through a printed circuit disposed on the transitional connecting surface 300. To increase the area for wiring, the main circuit board 1 is generally formed by laminating 4 to 8 layers of double-sided wiring boards. As the auxiliary circuit board 3 only requires disposing electrically conductive components on the transitional connecting surface 30, an ultra-thin single-sided board may be used.

Referring to FIG. 1 and FIG. 4, the electrical connector assembly in this embodiment further includes the heat dissipation device 4. The heat dissipation device 4 is disposed on the electronic element mounting surface 11 of the main circuit board 1, and includes a body portion 40 laid over the through hole 13 and a plurality of heat dissipation fins 41 extending upwards from the body portion 40. A thermally conductive material such as a silicone grease is filled between the bottom surface of the body portion 40 and the top surface of the metal shell 22. The metal shell 22 provides a heat dissipation function during operation of the processor 2, and can transfer heat generated during operation of the chip 21 to the body portion 40 through the thermally conductive silicone grease, and dissipate the heat through the heat dissipation fins 41. Furthermore, to ensure that the heat dissipation device 4 can be stably disposed on the electronic element mounting surface 11 and contact the metal shell 22, a fastener (not shown) may be used for fixing the heat dissipation device 4.

The assembling process of the electrical connector assembly in this embodiment is described as follows. Referring to FIG. 3, first, the contact members 200 of the substrate 20 are fixed to the first electrically conductive sheets 3010 of the auxiliary circuit board 3 by soldering. Then, the processor 2 and the auxiliary circuit board 3 are assembled to the main circuit board 1 from bottom to top as a whole, so that the processor 2 just enters the through hole 13. Next, the second electrically conductive sheets 3020 of the auxiliary circuit board 3 are fixed to the solder pads 120 of the main circuit board 1 by soldering. Finally, the heat dissipation device 4 is assembled to the electronic element mounting surface 11. Alternatively, the process may also be carried out in a reverse order. Referring to FIG. 5, first, the second electrically conductive sheets 3020 of the auxiliary circuit board 3 are fixed to the solder pads 120 of the main circuit board 1 by soldering. Then, the processor 2 is assembled into the through hole 13 from top to bottom. Next, the contact members 200 of the substrate 20 are fixed to the first electrically conductive sheets 3010 of the auxiliary circuit board 3 by soldering. Finally, the heat dissipation device 4 is assembled to the electronic element mounting surface 11.

Figure 6:
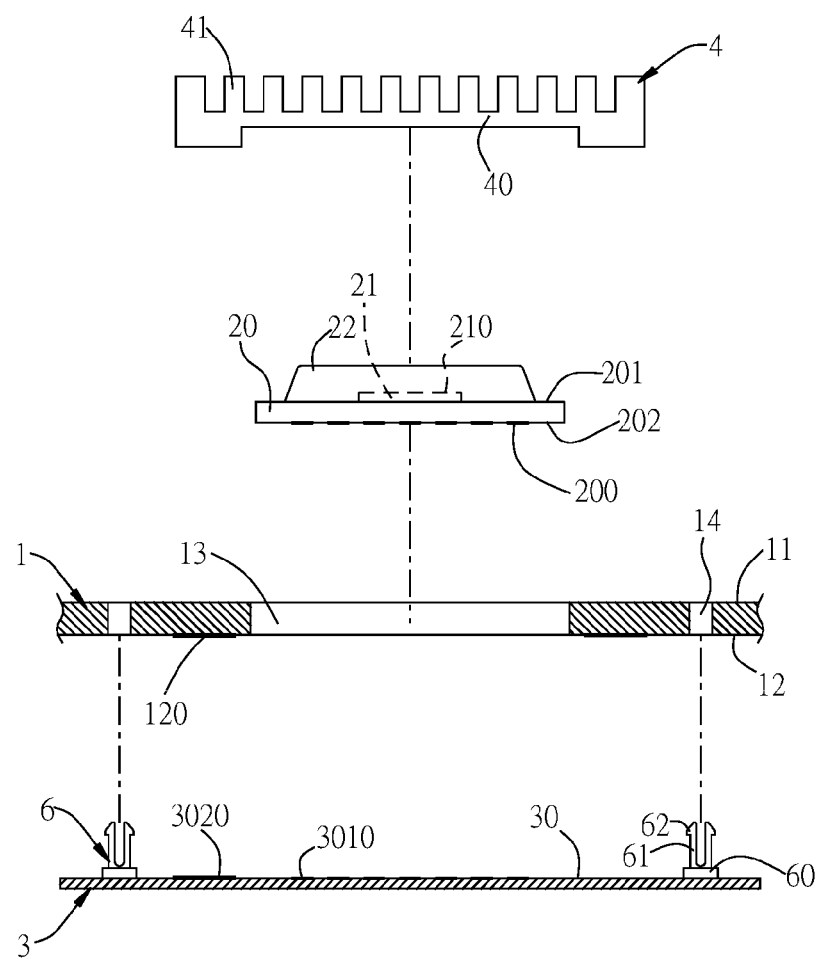
FIG. 6 is an exploded cross-sectional view of an electrical connector assembly according to a second embodiment of the present invention.

FIG. 6 shows a second embodiment of the present invention, which has basically the same structure as the first embodiment, except that in this embodiment, a fixing member 6 is additionally provided for fixing the main circuit board 1 and the auxiliary circuit board 3. The main circuit board 1 has a retaining slot 14 formed through the electronic element mounting surface 11 and the chassis mounting surface 12. The fixing member 6 includes a fixing portion 60 fixed to the transitional connecting surface 30 of the auxiliary circuit board 3 and corresponding to the retaining slot 14, and a holding portion 61 extending from the fixing portion 60 towards the main circuit board 1 and entering the retaining slot 14. The retaining slot 14 is formed through the main circuit board 1. One end of the holding portion 61 extends to form a hook portion 62 exposed and fastened to the electronic element mounting surface 11.

Figure 7:
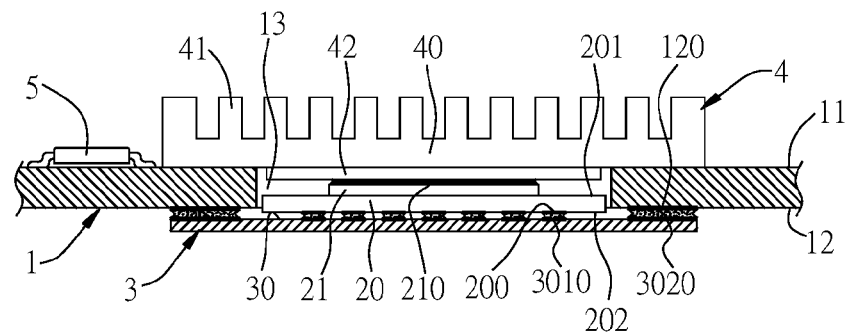
FIG. 7 is an assembled cross-sectional view of an electrical connector assembly according to a third embodiment of the present invention.

FIG. 7 shows a third embodiment of the present invention, which has basically the same structure as the first embodiment, except that in this embodiment, the processor 2 does not have the metal shell 22 in the first embodiment, and the heat dissipation device 4 partially enters the through hole 13. The heat dissipation device 4 is disposed on the electronic element mounting surface 11 of the main circuit board 1, and includes a body portion 40 laid over the through hole 13, and a thermally conductive portion 42 extending from the body portion 40 towards the through hole 13. In this embodiment, the chip 21 is located in the through hole 13, and the top surface 210 of the chip 21 does not exceed the electronic element mounting surface 11. As the processor 2 does not have the metal shell 22, the thermally conductive portion 42 may be designed to extend into the through hole 13 to directly contact the chip 21 for heat conduction. A thermally conductive silicone grease is disposed between the bottom surface of the thermally conductive portion 42 and the top surface 210 of the chip 21.

Figure 8:
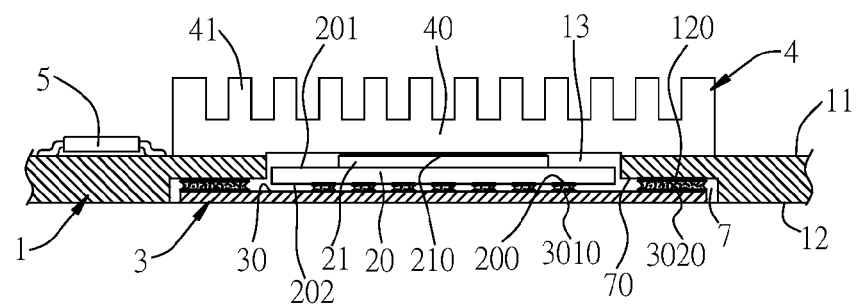
FIG. 8 is an assembled cross-sectional view of an electrical connector assembly according to a fourth embodiment of the present invention.

FIG. 8 shows a fourth embodiment of the present invention, which has basically the same structure as the third embodiment, except that in this embodiment, the main circuit board 1 is recessed with a groove 7 extending from the chassis mounting surface 12 towards the electronic element mounting surface 11. The groove 7 and the through hole 13 are in lateral communication, and form a step shape. The auxiliary circuit board 3 enters the groove 7 and is electrically connected to the main circuit board 1. In this embodiment, the groove 7 has a bottom wall 70 opposite to the electronic element mounting surface 11, and a plurality of solder pads 120 is disposed on the bottom wall 70. The auxiliary circuit board 3 partially enters the groove 7, and the second electrically conductive sheets 3020 are soldered to the solder pads 120 by using a solder material, so as to achieve the electrical connection between the main circuit board 1 and the auxiliary circuit board 3. The top surface 210 of the chip 21 is substantially aligned with the electronic element mounting surface 11, and alternatively, may be slightly higher than the electronic element mounting surface 11. At this time, to reduce the height, since the metal shell 22 has been omitted, the heat dissipation device 4 is directly disposed on the main circuit board 1 to directly contact the chip 21. As the processor 2 and the auxiliary circuit board 3 are completely located in the through hole 13, the height of the entire electrical connector assembly is not influenced by the height of the processor 2 and the auxiliary circuit board 3. In this way, the overall height can be further reduced, thereby achieving an ultra-thin structure.

Figure 9:
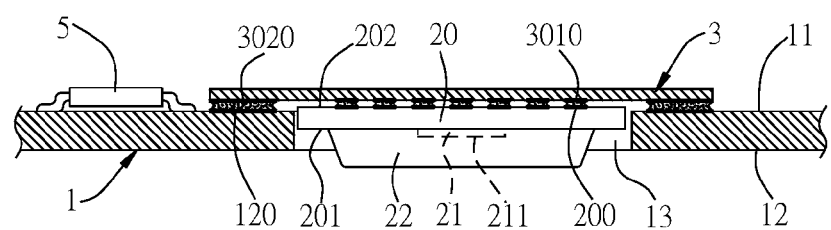
FIG. 9 is an assembled cross-sectional view of an electrical connector assembly according to a fifth embodiment of the present invention.

FIG. 9 shows a fifth embodiment of the present invention. The structures and connection relationship of the processor 2 and the auxiliary circuit board 3 are the same as those in the first embodiment. The difference between this embodiment and the first embodiment lies in that the processor 2 and the auxiliary circuit board 3 are overturned and disposed on the main circuit board 1. In this embodiment, the solder pads 120 of the main circuit board 1 are disposed on the upper surface 11, that is, the electronic element mounting surface 11. After the processor 2 is overturned and disposed, the second electrically conductive sheets 3020 of the auxiliary circuit board 3 are soldered to the electronic element mounting surface 11 of the main circuit board 1, the chip 21 is located in the through hole 13, and the bottom surface 211 of the chip 21 does not exceed the chassis mounting surface 12. This embodiment has the metal shell 22 in the first embodiment, and the metal shell 22 is partially located in the through hole 13. As the processor 2 is overturned, after the main circuit board 1 is mounted onto the computer chassis, the metal shell 22 directly contacts the computer chassis (not shown), so as to directly transfer heat generated during operation of the processor 2 to the computer chassis and dissipate the heat to the outside. In this way, the heat dissipation device 4 in the first embodiment can be omitted. Definitely, the present invention is not limited thereto. When the main circuit board 1 is directly attached to the computer chassis, the chassis mounting surface 12 and the computer chassis are in close fit, with no gap formed between the two. At this time, to reduce the overall height of the electrical connector assembly, a thin metal shell may be used, so that the bottom surface of the metal shell 22 is aligned with the chassis mounting surface 12, and the bottom surface of the metal shell 22 directly contacts the computer chassis to dissipate heat. Alternatively, the metal shell may be omitted, in which case the chip 21 is used to directly contact the computer chassis to dissipate heat.

The present invention, among other things, has the following beneficial effects.

1. The through hole 13 is formed in the main circuit board 1, the chip 21 is located in the through hole 13, and the substrate 20 is at least partially located in the through hole 13. Through such a structure where the chip 21 and the substrate 20 sink into the through hole 13, the processor 2 and the main circuit board 1 mostly overlap with each other in view of height, which reduces the overall height of the electrical connector assembly, and can meet the requirements for development of notebook computers towards ultra-thin structures.

2. As the auxiliary circuit board 3 enters the groove 7 and is electrically connected to the main circuit board 1, the processor 2 and the auxiliary circuit board 3 sink into the main circuit board 1, so that the overall height of the electrical connector assembly is further reduced.

3. The processor 2 and the main circuit board 1 are respectively electrically connected to the transitional connecting surface 30 of the auxiliary circuit board 3. The electrical connection between the processor 2 and the main board 1 thus can be realized through a printed circuit and the first conducting region 301 and the second conducting region 302 electrically connected to each other on one surface of the auxiliary circuit board 3. And the first conducting region 301 may be designed to be arranged in a matrix corresponding to the contact members 200 on the substrate 20. Therefore, an ultra-thin printed circuit board (PCB) can be used to implement the connection between the main circuit board 1 and the processor 2, so that the height is reduced without changing the design of solder joints of the processor 2 in the related art, which neither increases the process complexity nor causes short circuit, and is compatible with the matrix arrangement of solder joints of the processor 2 in the related art.

4. As the auxiliary circuit board 3 is electrically connected to the chassis mounting surface 12 of the main circuit board 1, a part of the substrate 20 and the entire auxiliary circuit board 3 are located in a gap between the chassis mounting surface 12 and the side wall of the chassis, so that by making full use of the gap to accommodate the auxiliary circuit board 3 and the substrate 20, the overall height of the processor 2 and the main circuit board 1 relative to the chassis can be reduced, and the electrical connection between the processor 2 and the main circuit board 1 can be achieved.

5. As the heat dissipation device 4 partially enters the through hole 13 to contact the processor 2, the overall height of the heat dissipation device 4 relative to the chassis can be reduced, thereby achieving an ultra-thin structure of the electrical connector assembly while ensuring a good heat dissipation function for the processor 2.

6. When the processor 2 is overturned and disposed on the main circuit board 1, the metal shell 22 directly contacts the computer chassis, so as to directly transfer heat generated during operation of the processor 2 to the computer chassis and dissipate the heat to the outside. In this way, the heat dissipation device 4 can be omitted.

7. As the fixing member 6 is disposed between the main circuit board 1 and the auxiliary circuit board 3, the main circuit board 1 is fixed to the auxiliary circuit board 3 more stably.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments are chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical connector assembly, comprising:
   (a) a main circuit board, having a through hole formed through the main circuit board;
   (b) a processor, comprising a chip and a substrate, wherein the chip is electrically connected to the substrate and located in the through hole, and the substrate is at least partially located in the through hole; and
   (c) an auxiliary circuit board, having a transitional connecting surface, wherein a first conducting region and a second conducting region electrically connecting to each other are disposed on the transitional connecting surface, the first conducting region is electrically connected to the substrate, and the second conducting region is electrically connected to the main circuit board.

2. The electrical connector assembly according to claim 1, wherein the substrate has a first conducting surface and a second conducting surface disposed opposite to each other, the first conducting surface is electrically connected to the chip, and a plurality of contact members is disposed on the second conducting surface and electrically connected to the first conducting region of the auxiliary circuit board.

3. The electrical connector assembly according to claim 2, wherein the contact members are arranged on the second conducting surface in a matrix.

4. The electrical connector assembly according to claim 1, wherein the thickness of the auxiliary circuit board is smaller than that of the main circuit board.

5. The electrical connector assembly according to claim 1, wherein the main circuit board has an upper surface and a lower surface disposed opposite to each other, and the second conducting region of the auxiliary circuit board is electrically connected to the lower surface of the main circuit board.

6. The electrical connector assembly according to claim 5, wherein the chip has a top surface located in the through hole and not exceeding the upper surface of the main circuit board.

7. The electrical connector assembly according to claim 1, wherein the main circuit board has an upper surface and a lower surface disposed opposite to each other, and the second conducting region of the auxiliary circuit board is electrically connected to the upper surface of the main board.

8. The electrical connector assembly according to claim 7, wherein the chip has a bottom surface located in the through hole and not exceeding the lower surface of the main circuit board.

9. The electrical connector assembly according to claim 1, wherein the main circuit board is connected and fixed to the auxiliary circuit board through a fixing member.

10. The electrical connector assembly according to claim 1, wherein the processor further comprises a metal shell at least partially located in the through hole and covering the chip.

11. The electrical connector assembly according to claim 1, wherein a heat dissipation device is disposed on one side of the main circuit board to contact the processor.

12. The electrical connector assembly according to claim 11, wherein the heat dissipation device at least partially enters the through hole.

13. The electrical connector assembly according to claim 1, wherein the main circuit board is recessed with a groove in lateral communication with the through hole, and the auxiliary circuit board at least partially enters the groove and is electrically connected to the main circuit board.

* * * * *